(12) United States Patent
Jeng et al.

(10) Patent No.: US 8,058,151 B2
(45) Date of Patent: Nov. 15, 2011

(54) METHODS OF DIE SAWING

(75) Inventors: Shin-Puu Jeng, Hsinchu (TW); Hao-Yi Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/798,587

(22) Filed: Apr. 6, 2010

(65) Prior Publication Data

US 2010/0197114 A1      Aug. 5, 2010

Related U.S. Application Data

(62) Division of application No. 11/424,367, filed on Jun. 15, 2006, now Pat. No. 7,732,897.

(51) Int. Cl.
*H01L 21/46* (2006.01)
*H01L 21/78* (2006.01)
*H01L 21/301* (2006.01)

(52) U.S. Cl. ......... 438/460; 438/680; 257/E21.006; 257/E21.027; 257/E21.17; 257/E21.32; 257/E21.217; 257/E21.238; 257/E21.249; 257/E21.267

(58) Field of Classification Search .......... 438/460, 438/20, 30, 678, 680, 687, 688, 742, 769, 438/672; 257/E21.32, 17, 6, 27, 238, 267, 257/217, 249
See application file for complete search history.

(56) References Cited

U.S. PATENT DOCUMENTS

| | | | |
|---|---|---|---|
| 6,271,578 B1 | 8/2001 | Mitwalsky et al. | |
| 6,362,524 B1 | 3/2002 | Blish et al. | |
| 6,851,801 B2 | 2/2005 | Niikura | |
| 6,867,489 B1 | 3/2005 | Estacio | |
| 6,951,801 B2 | 10/2005 | Pozder et al. | |
| 7,732,897 B2 * | 6/2010 | Jeng et al. ............ | 257/620 |
| 2004/0147097 A1 | 7/2004 | Pozder et al. | |
| 2004/0219766 A1 | 11/2004 | Headley et al. | |
| 2006/0055002 A1 | 3/2006 | Yao et al. | |

* cited by examiner

*Primary Examiner* — David Nhu
(74) *Attorney, Agent, or Firm* — Duane Morris LLP

(57) ABSTRACT

A structure includes a substrate having a plurality of scribe line areas surrounding a plurality of die areas. Each of the die areas includes at least one first conductive structure formed over the substrate. Each of the scribe line areas includes at least one active region and at least one non-active region. The active region includes a second conductive structure formed therein. The structure further includes at least one first passivation layer formed over the first conductive structure and second conductive structure, wherein at least a portion of the first passivation layer within the non-active region is removed, whereby die-sawing damage is reduced.

11 Claims, 10 Drawing Sheets

METHODS OF DIE SAWING

RELATED APPLICATION

This application is a divisional application of U.S. patent application Ser. No. 11/424,367, filed on Jun. 15, 2006 and now U.S. Pat. No. 7,732,897 B2, the contents of which are hereby incorporated by reference as if set forth in their entirety.

BACKGROUND OF THE INVENTION

1. Field of the Invention

The present invention relates to methods for forming semiconductor substrates, and more particularly to methods of die sawing and structures formed thereby.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed goals, dimensions of semiconductor integrated circuits continue to shrink. Various materials and techniques have been proposed to achieve these integration and speed goals and to overcome manufacturing obstacles associated therewith.

In order to achieve these targets, a multi-layer interconnect structure is used. Generally, various test patterns, including a layer of metal or other metal structure, are formed within scribe line areas defined on a wafer for measurements of physical or electrical characteristics associated with the multi-layer interconnect structure. The test patterns are subjected to a wafer acceptance test (WAT). Through collection of information indicative of the physical or electrical characteristics, it is determined whether performances of devices or circuits formed within die areas surrounded by the scribe line areas are acceptable. After WAT measurements, the wafer is subjected to a sawing process along the scribe line areas for singulating the dies formed on the wafer.

FIG. 1 is a cross-sectional view showing a prior art structure during sawing. A substrate 100 includes a plurality of die areas and scribe line areas. Integrated circuits or devices are formed within the die areas. The scribe line areas separate the die areas for isolation of integrated circuits formed within different die areas. The scribe line areas are the areas along which the substrate 100 is sawed.

In each of the die areas, an interconnection structure 110 is formed therein. The interconnection structure 110 comprises a multi-layer structure, such as metal layers 101, 103 and 105. The metal layers 101, 103 and 105 are separated by dielectric layers 102 and 104. The metal layers 101, 103 and 105 are connected to each other by way of vias/contacts 107 and 108 formed within the dielectric layers 102 and 104, respectively. A passivation layer 106 with openings 120 is formed over the interconnection structures 110 and the dielectric layer 104. The passivation layer 106 is a dielectric layer or polyimide layer. The openings 120 are formed by a photolithographic process and an etch process so that a subsequent conductive layer can be formed therein for purpose of electrical connection.

A blade 130 saws the substrate 100 along the scribe line areas to obtain a plurality of individual dies. The sawing process may crack the multi-layer structure, e.g., the passivation layer 106, dielectric layers 102 and/or 104, within the scribe line areas. The cracking of the multi-layer structure can result in mechanical failure or contamination of the dies. This situation worsens if the dielectric layers 102 and 104 are extreme low-k (ELK) dielectric layers, which are extremely fragile.

As described above, the scribe line areas also include WAT patterns (not shown) that include at least one layer of metal or metal structure (not shown). During a sawing process, the metal layer of the WAT patterns is also subjected to the mechanical stress and force applied by the blade 130. Unlike low-k dielectric materials, metal material layers, such as copper, tend to be soft and extensible, allowing pieces of metal to attach to the blade 130 during the sawing process. These metal fragments not only can worsen cracking of the passivation layer 106, dielectric layers 102 and/or 104, but also can dull the blade 130.

By way of background, U.S. Pat. No. 6,951,801 provides a process for removing metal from a scribe area of a semiconductor wafer, the entirety of which is hereby incorporated by reference herein.

From the foregoing, improved singulation methods, such as improved sawing methods, and structures formed thereby are desired.

SUMMARY OF THE INVENTION

In accordance with some exemplary embodiments, a structure includes a substrate having a plurality of scribe line areas surrounding a plurality of die areas. Each of the die areas includes at least one first conductive structure formed over the substrate. Each of the scribe line areas includes at least one active region and at least one non-active region. The active region includes a second conductive structure formed therein. The structure further includes at least one first passivation layer formed over the first conductive structure and second conductive structure, wherein at least a portion of the first passivation layer within the non-active region is removed, whereby die-sawing damage is reduced.

In accordance with some exemplary embodiments, a sawed die comprises a die area and a scribe line area. The die area comprises at least one conductive structure formed therein. The scribe line area comprises at least one active region and at least one non-active region. The sawed die further comprises at least one first passivation layer formed over the conductive structure within the die area and within the scribe line area, wherein at least a portion of the first passivation layer within the non-active region is removed, whereby die-sawing damage is reduced.

In accordance with some exemplary embodiments, a method comprises the steps of: (a) defining a plurality of scribe line areas surrounding dies on a substrate, each of the scribe line areas comprising at least one active region and at least one non-active region, wherein each of the dies comprises at least one first conductive structure formed therein and the active region comprises at least one second conductive structure formed therein; (b) forming a first passivation layer over the first conductive structure within each of the dies and over the second conductive structure within the active region; (c) removing at least a portion of the thickness of the first passivation layer within the non-active region, whereby die-sawing damage is reduced; and (d) sawing the substrate along the scribe line areas with the non-active region.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
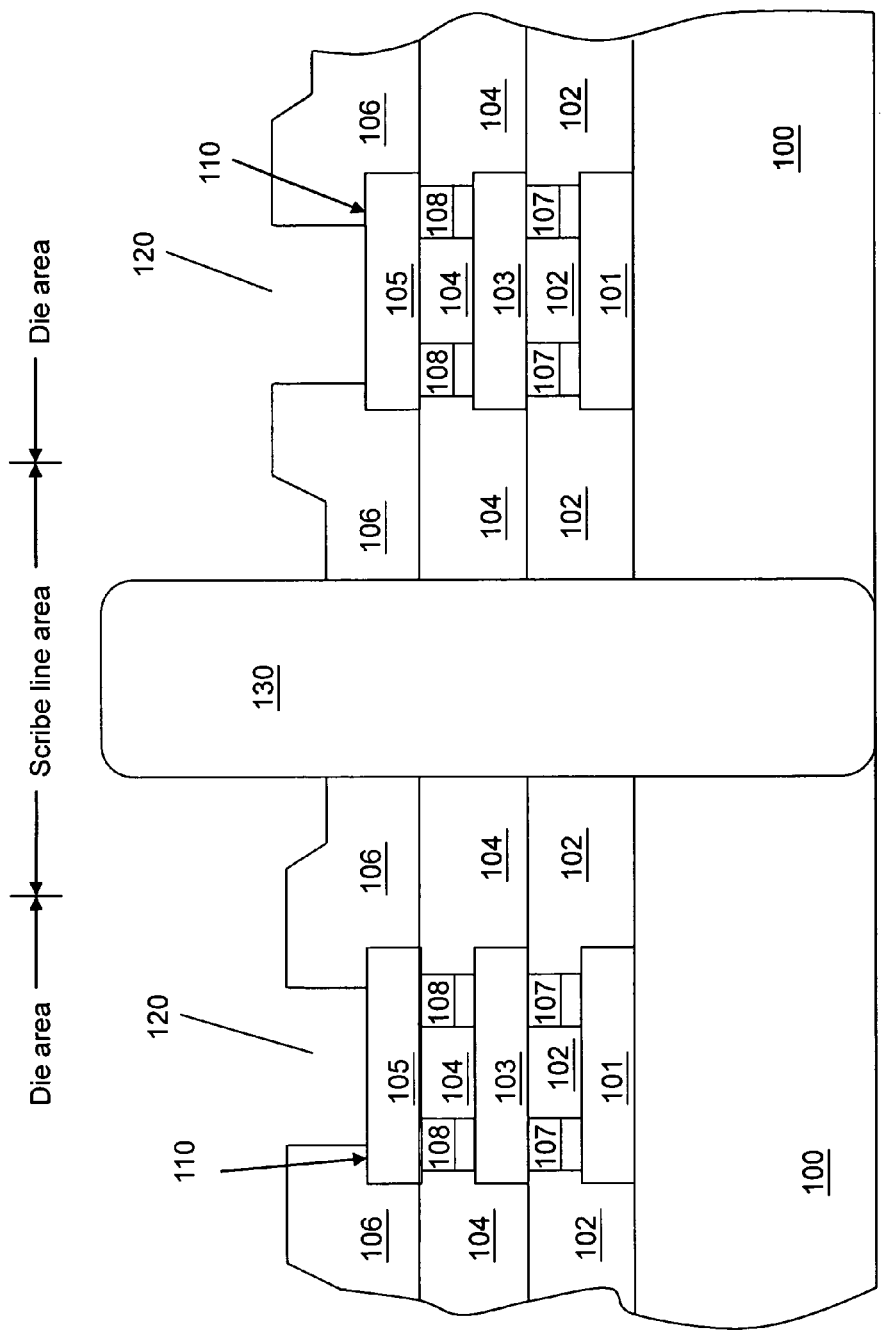
FIG. 1 is a cross-sectional view showing a prior art structure during sawing.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2:
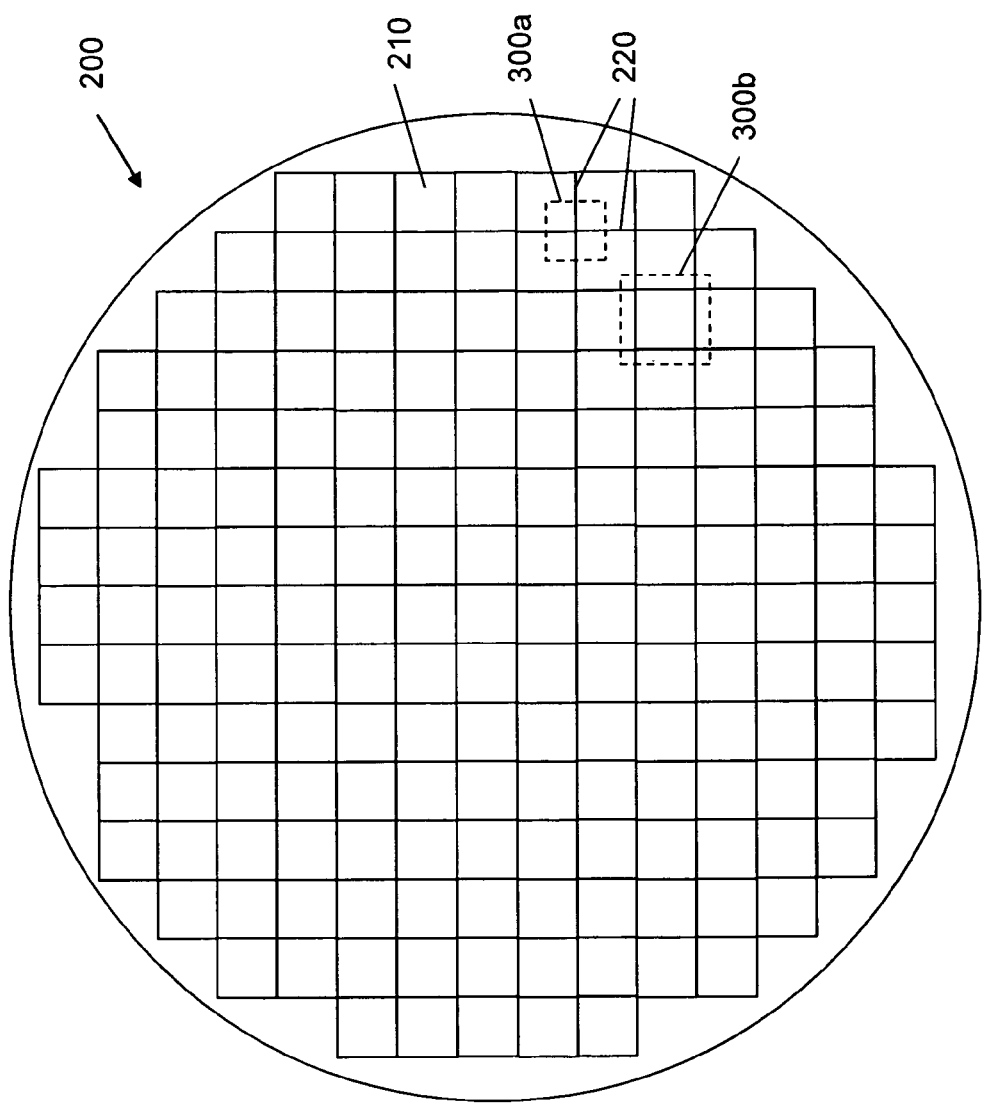
FIG. 2 is a schematic top view of an exemplary wafer substrate.

FIG. 2 is a schematic top view of an exemplary wafer substrate. The substrate 200 comprises a plurality of die areas 210 and a plurality of scribe line areas 220 surrounding the die areas 210. The substrate 200 can be a silicon substrate, III-V compound substrate, display substrate such as a liquid crystal display (LCD), plasma display, cathode ray tube display or electro luminescence (EL) lamp display, or light emitting diode (LED) substrate (collectively referred to as, substrate 200), for example. A plurality of devices and circuits (not shown) are formed within the die areas 210 for formation of desired integrated circuits. The scribe line areas 220 separate the die areas 210 for isolation of devices or circuits formed in different die areas 210. The scribe line areas 220 are subjected to a sawing process for singulating dies as shown in FIG. 3B. A die sawing apparatus (not shown) including a blade saws the substrate 200 along the scribe line areas 220 so that the die-sawing process does not substantially damage the die areas 210 surrounded by the scribe line areas 220. Areas 300a and 300b are portions of the substrate 200. Detailed descriptions of the areas 300a and 300b are provided below.

Figure 3A:
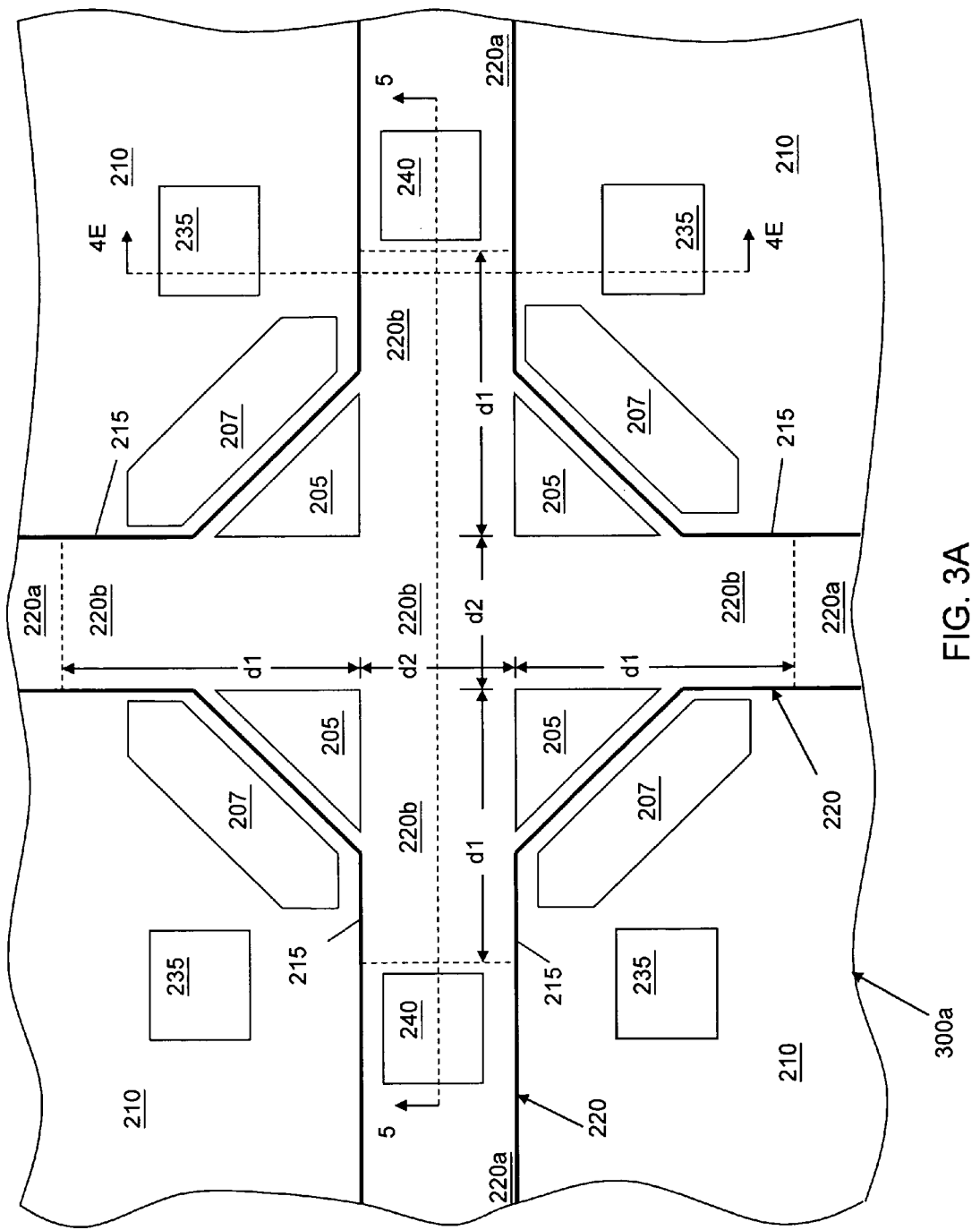
FIG. 3A is an enlarged schematic drawing of area 300a shown in FIG. 2.
Figure 3B:
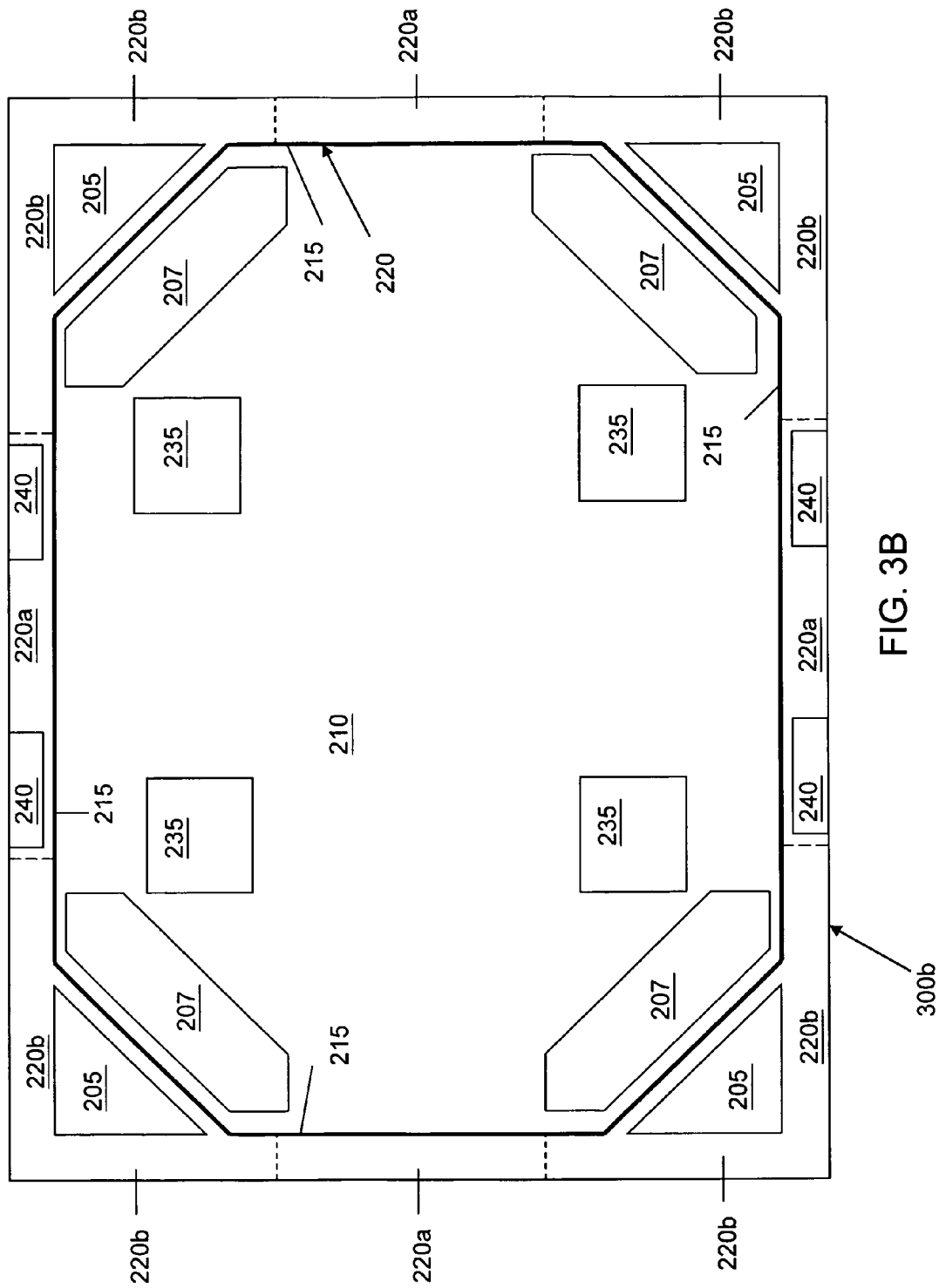
FIG. 3B is enlarged schematic drawing of area 300b shown in FIG. 2.

FIG. 3A is an enlarged schematic drawing of area 300a shown in FIG. 2. FIG. 3B is an enlarged schematic drawing of area 300b shown in FIG. 2. Like items shown in FIGS. 3A and 3B are identified by the same reference numerals. Area 300b represents a die 210 surround by a scribe line area 220 whereas area 300a shows the intersection of several dies at a pair of orthogonal scribe line areas 220.

Referring first to FIG. 3A, in some embodiments, the area 300a comprises areas 205, guard rings 215, scribe line areas 220 and die areas 210. Each of the scribe line areas 220 comprises at least one active region 220a and at least one non-active region 220b. Each of the die areas 210 comprises at least one conductive structure 235. The active region 220a refers to a region in which at least one functional device or electrical test pattern, such as a wafer acceptance test (WAT) pattern, is formed. Before processing as described below, in embodiments the active region 220a can comprise, for example, at least one material layer, such as a dielectric layer (e.g., oxide layer, nitride layer, oxynitride layer, extreme low-k (ELK) dielectric layer or low-k dielectric layer) or conductive layer (e.g., copper (Cu) layer, aluminum (Al) layer or aluminum copper (AlCu) layer). In some embodiments, the active region 220a comprises a conductive structure 240 coupled to a wafer acceptance test (WAT) pattern. The non-active region 220b refers to a region in which no functional device or electrical test pattern is formed. Before being processed as described below and being subjected to a sawing process, the non-active region 220b can comprise at least one material layer, such as a dielectric layer (e.g., oxide layer, nitride layer, oxynitride layer, extreme low-k (ELK) dielectric layer or low-k dielectric layer) and/or a conductive layer (e.g., copper (Cu) layer, aluminum (Al) layer or aluminum copper (AlCu) layer), shown in FIG. 4A. In some embodiments, the non-active region 220b is metal-free, i.e., the non-active region 220b does not include any metal layer or structure.

The areas 205 are arranged proximate to the corners of the die areas 210, e.g., proximate to the intersection of two scribe line areas 220. Each of the areas 205 includes at least one dummy pattern (not shown) formed therein for relief of stresses that concentrate at the corners of the die areas 210 when a sawing process is performed near the corners. By providing stress relief areas 205, the sawing process may be prevented from substantially damaging the corner areas of the die areas 210. In some embodiments, the areas 205 are not used if the stresses proximate to the corners of the die areas 210 are not a concern when the sawing process is performed near the corner.

The seal rings 215 are arranged between the die areas 210 and the scribe line areas 220 to prevent the propagation of cracks from the scribe line areas 220 to the die areas 210 when a sawing process is performed along the scribe line areas 220. In most embodiments, the seal rings 215 are used to block moisture penetration.

In some embodiments, second dummy pattern areas 207 are defined within the seal rings 215 and proximate to the areas 205 for relief of stresses that concentrate proximate to the corners of the die areas 210 when the sawing process is performed near the corners. In some embodiments, edges of the dummy pattern areas 207 within the seal ring 215 extend substantially along and parallel to the seal 215. In still other embodiments, the dummy pattern areas 207 are not used if the stresses that concentrate proximate to the corners of the die areas 210 are not a concern.

During singulation, the intersection area of the orthogonal scribe line areas 220 is subjected to two sawing processes, i.e., a vertical sawing process and a horizontal sawing process. The intersection region, therefore, is more vulnerable than the other regions to stresses induced by sawing. In some embodiments, as shown in FIG. 3A, the non-active regions 220b are arranged at the intersection of the scribe line areas 220 so as to form a cross-shaped region. As described above, in some embodiments the non-active regions 220b are metal-free. The placement of the non-active regions 220b at the intersection of the scribe lines 220b can effectively reduce damage resulting from die sawing. In some embodiments using 65-nm or 45-nm technology, the non-active region 220b has the following dimensions: a distance "d1" of about 50-200 μm from an edge of the non-active region 220b to an edge of the area 205, and a distance "d2" of about 20-150 μm from an edge of the area 205 to an edge of another area 205. In still other embodiments, the non-active region 220b is arranged within the scribe line area 220 more proximate to a middle area of the die area 210.

The areas 205, dummy pattern areas 207, die areas 210, seal rings 215 and scribe line areas 220 can be defined by several photolithographic and/or etch processes cooperating with each other. Detailed descriptions of structures within the die areas 210 and the scribe line areas 220 are provided below.

FIGS. 4A-4E are schematic cross-sectional drawings showing a process for formation of an exemplary structure shown in FIG. 3A taken along section line 4E-4E of FIG. 3A.

Figure 4A:
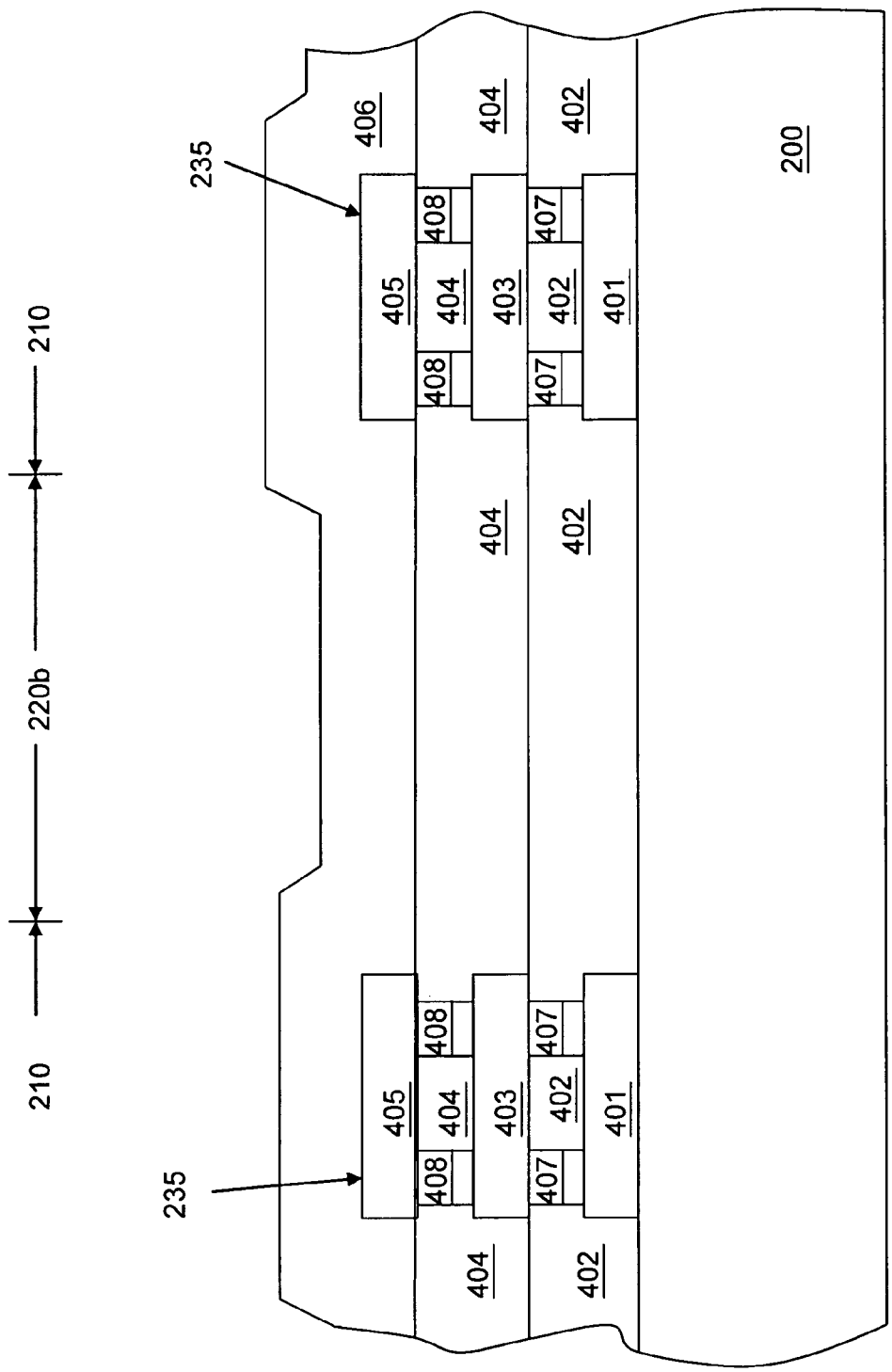
FIGS. 4A-4E are schematic cross-sectional drawings showing a process for a formation of an exemplary structure shown in FIG. 3A taken along section line 4E-4E of FIG. 3A.

Referring to FIG. 4A, the die area 210 comprises at least one conductive structure 235 formed therein. The conductive structure 235 is coupled to at least one circuit or device (not shown) formed over or within the substrate 200. The non-active region 220b comprises at least one material layer, such as dielectric layers 402 and/or 404. The conductive structure 235 and the dielectric layers 402 and 404 are formed over the substrate 200. The material of the dielectric layer 402 and 404 can be, for example, oxide, nitride, oxynitride, low-k dielectric material, ELK dielectric material or other material that is adapted to electrically isolate conductive layers, such as 401, 403 and/or 405. The dielectric layer 402 and 404 can be formed, for example, by a chemical vapor deposition (CVD) process, spin-on coating process, thermal process or other method that is adapted to form dielectric material layers.

The conductive structure 235 comprises at least one conductive layer, such as conductive layers 401, 403 and/or 405. The conductive layers 401, 403 and 405 can be, for example, aluminum (Al), copper (Cu), aluminum/copper (AlCu), polysilicon or other conductive material. The conductive layers 401, 403 and 405 can be formed, for example, by a chemical vapor deposition (CVD) process, physical vapor deposition (PVD) process, chemical electrical plating process, chemical electroless plating process or other process that is adapted to form a conductive layer. The conductive layer 405 is generally referred to as the "top metal layer" which means that the conductive layer 405 is the top conductive layer connected to a pad structure (not shown in FIG. 4A, but shown in FIG. 4C). The conductive layers 401, 403 and 405 are connected to each other via conductive contacts, such as vias or contacts 407 and/or 408. The material of the conductive contacts 407 and 408 can be, for example, tungsten (W), Al, Cu, AlCu, polysilicon or other conductive material. The conductive contacts 407 and 408 can be formed by, for example, a chemical vapor deposition (CVD) process, physical vapor deposition (PVD) process, chemical electrical plating process, chemical electroless plating process or other conductive film formation process.

The numbers of the conductive layers 401, 403 and 405 and the numbers of the dielectric layers 402 and 404 shown in FIG. 4A are merely exemplary. It should be understood that the number of the conductive layers can vary according to the applied semiconductor technology. For example, in some embodiments of 0.45-μm or 0.65-μm technology, the conductive structure 235 may have about 8 to 10 conductive layers. One of ordinary skill in the art can readily form a desired conductive structure 235 based on the selected technology.

A passivation layer 406 is formed over the conductive structure 235 within the die area 210 and over the dielectric layer 404 within the non-active region 220b. The passivation layer 406 comprises, for example, at least one dielectric layer or at least one polyimide layer. In some embodiments, the passivation layer 406 comprises a multi-layer structure, such as nitride/oxide/nitride/oxide having thickness of about 500-2,000 Å/1,000-2,000 Å/2,000-4,000 Å/1,000-2,000 Å, respectively. The multi-layer structure can be formed, for example, by CVD.

Figure 4B:
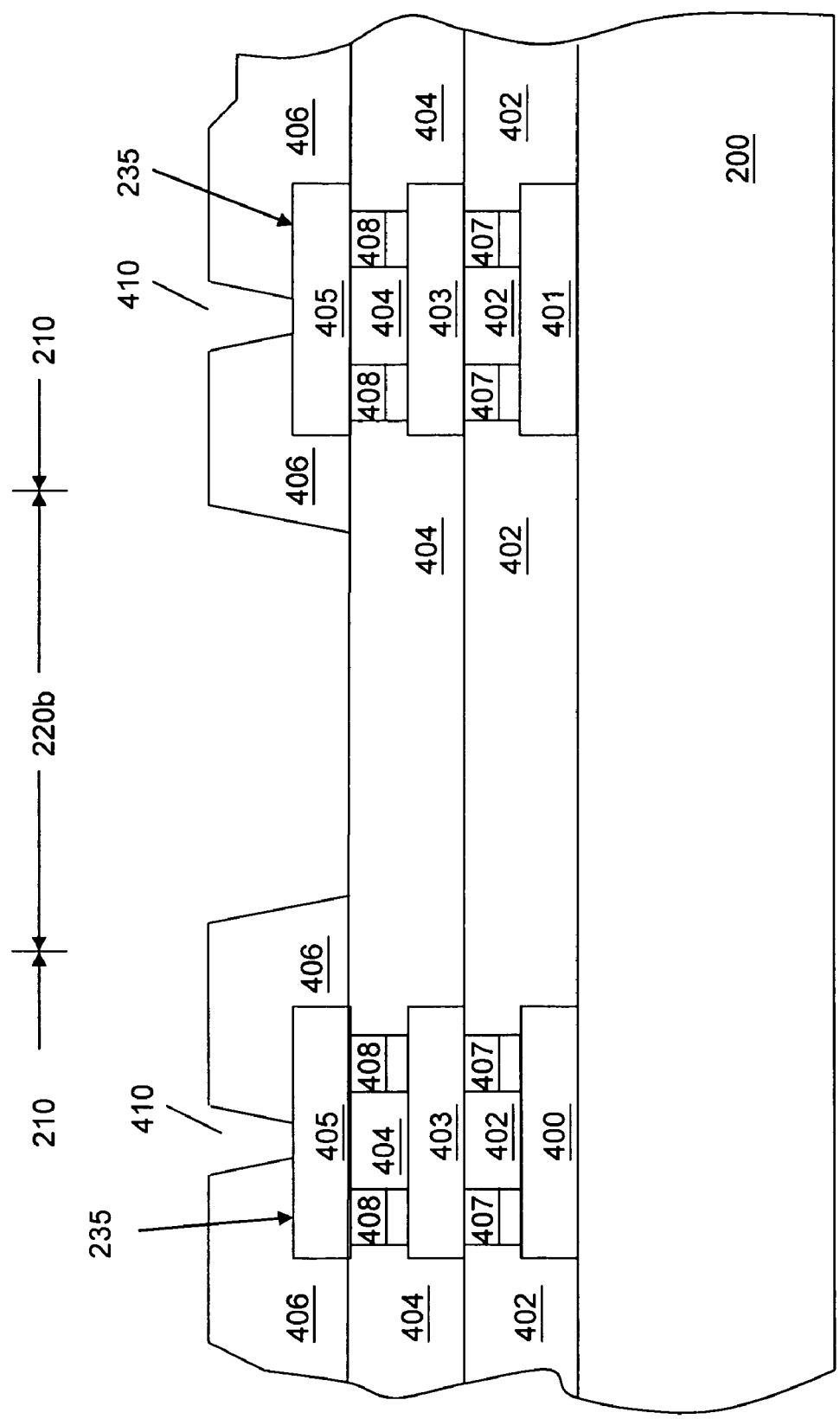

FIG. 4B is a schematic drawing showing that a portion of the passivation layer 406 is removed according to an exemplary process. After the formation of the passivation layer 406, a photolithographic process is performed. The photolithographic process is generally referred to as the "Passivation-1 Photo" for defining contact openings 410 to the conductive layer 405 and/or fuse regions (not shown). In this photolithographic process, a photoresist layer (not shown) is formed over the passivation layer 406. The photoresist layer also covers the scribe line areas 220. A reticle (not shown) with predefined regions corresponding to the contact openings 410 and/or fuse openings (not shown) is used. Whether the predefined regions on the reticle are transparent or opaque depends on the material property of the applied photoresist, such as whether the photoresist is a positive photoresist and negative photoresist, respectively. In some embodiment, this reticle also includes at least one predefined region corresponding to the non-active region 220b (shown in FIGS. 3 and 4B). An exposure process and a developing process are then performed to define a desired photoresist pattern with openings (not shown) partially exposing portions of the top surface of the passivation layer 406 corresponding to contact opening regions, fuse regions and the non-active region 220b. An etch process is performed to remove a portion of the passivation layer 406 within the die area 210 to form the openings 410, which partially expose a top surface of the conductive layer 405, top surfaces of fuse layers (not shown) and the top surface of the dielectric layer 404 within the non-active region 220b. In other embodiments, the process includes an over-etch step that partially removes the passivation layer 406 and also a portion of the dielectric layer 404 so that at least a portion of the top surface of the dielectric layer 404 within the non-active region 220b is lower than that of the dielectric layer 404 within the die area 210. The over-etch step is acceptable as long as the over-etch step does not substantially damage the partially exposed top surface of the conductive layer 405 within the opening 410. The patterned photoresist layer (not shown) is then removed by a photoresist removal process.

With the reduced thickness of the passivation layer 406 and/or the dielectric layer 404 within the scribe line area 220 (or other layers within the scribe line areas 220 as described below), the structure shown in FIG. 4B is less susceptible to cracking of the layers that extend from the die areas 210 into the scribe line areas 220. As described above, with the prior art structures the intersection area of the scribe line regions 220 is more vulnerable than the other regions because the former is subjected to multiple sawing processes. However, with the present design, the thickness-reduced region, e.g., the non-active region 220b, that is arranged at the intersection of the scribe line areas 220 is less susceptible to cracking when the structure shown in FIG. 4B is subjected to sawing processes.

Figure 4C:
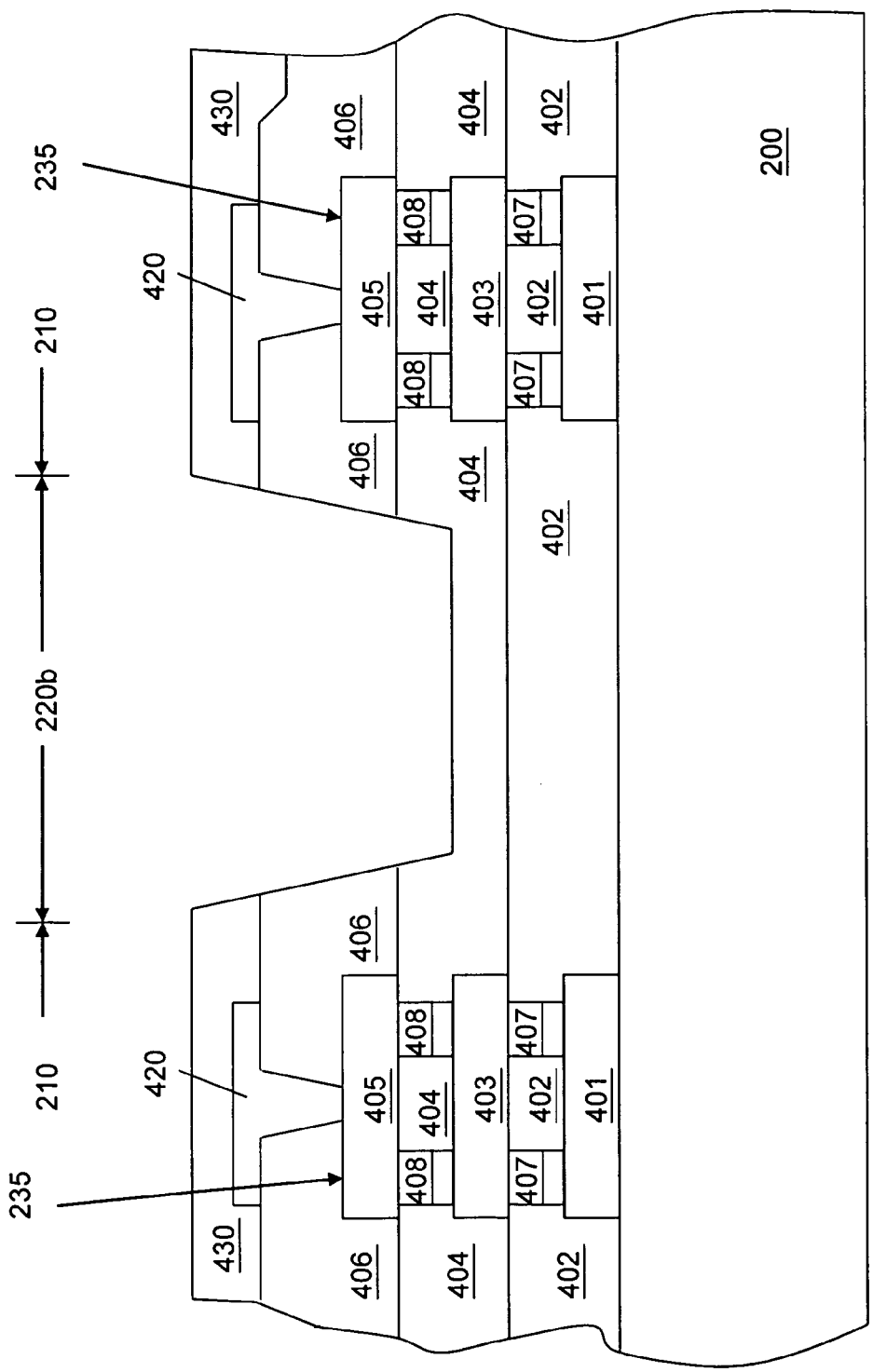

As shown in FIG. 4C, conductive layers 420 are formed within the openings 410 over the passivation layer 406 and a second passivation layer 430 is formed over the conductive layer 420. After removal of the patterned photoresist layer (not shown) described in FIG. 4B, a layer of conductive material (not shown) provided for the formation of the conductive layers 420 is then formed over the substrate shown in FIG. 4B. The layer of conductive material fills the openings 410. A photolithographic process and an etch process are then used to define the layer of conductive material to form the conductive layers 420 and fuse layers (not shown). In some embodiments, the conductive layer 420 can be, for example, a pad structure that will be connected to a bump structure (not shown). In some embodiments, the fuse layers are not used because the manufactured devices or circuits formed within the die areas 210 are not designed with the fuse function. In some embodiments, the conductive layer 420 comprises a multi-layer structure, such as tantalum nitride (TaN)/AlCu/silicon oxynitride (SiON) with thicknesses of about 200-1,000 Å/0.5-2 μm/200-1,000 Å, respectively.

A layer of material (not shown) provided for the formation of the passivation layer 430 is then formed over the conductive layer 420 and also within the scribe line areas 220. In some embodiments, the layer of material comprises a multi-layer structure, such as a plasma enhanced (PE) oxide layer/a nitride layer having a thickness of about 1,000-5,000 Å/1,000-7,000 Å, respectively. The multi-layer structure can be formed, for example, by CVD processes. After the formation of the layer of material, a photolithographic process is performed. The photolithographic process is generally referred to as the "Fuse Window Photo" for defining fuse openings to partially expose top surfaces of fuse layers (not shown). In this photolithographic process, a photoresist layer (not shown) is formed over the layer of material in the die areas 210 and scribe line areas 220. A reticle (not shown) with predefined regions corresponding to fuse openings (not shown) is used. The fuse openings are formed in the die area 210 (shown in FIG. 3), partially exposing the fuse layers so that a subsequent process, such as a laser fusing process, is used to personalize or repair integrated circuits (not shown) formed within the die areas 210.

In some embodiments, this reticle also includes at least one predefined region corresponding to the non-active regions 220b (shown in FIGS. 3 and 4C). An exposing process and a developing process are performed to define a desired photoresist pattern with openings therein (not shown) partially exposing a top surface of the layer of material corresponding to the fuse openings and/or the non-active region 220b. An etch process using the patterned photoresist layer removes a portion of the layer of material within the die area 210 for the formation of fuse openings (not shown) to partially expose top surfaces of the fuse layers (not shown). In exemplary embodiments, the process also removes at least a portion of the passivation layer 430 within the non-active region 220b. In some embodiments, the etch process removes the portion of the passivation layer 430 within the non-active region 220b to at least partially expose a top surface of the dielectric layer 404. The etch process is acceptable as long as the etch process substantially removes the passivation layer 430 within the fuse openings (not shown) in the die area 210 so that a subsequent laser process can personalize or repair circuits or devices formed within the die areas 210. In still other embodiments as shown in FIG. 4C, the etch process includes an over-etch step that removes at least a portion of the thickness of the dielectric layer 404 or even of the dielectric layer 402 so that the top surface of the dielectric layer 404 or 402 in the non-active region 202b is lower than the corresponding surface of the dielectric layer 404 or 402 in the die area 210, respectively. The over-etch step is acceptable as long as the over-etch process does not substantially damage the partially exposed top surfaces of the fuse layers. The patterned photoresist layer (not shown) is then removed by a photoresist removal process.

With the reduced thickness of the material layers, such as the passivation layer 430, the dielectric layer 404 and/or the dielectric layer 402, within the scribe line areas 220, the structure shown in FIG. 4C is less susceptible to cracking of the layers within the scribe line areas 220. As described above, the intersection area of the scribe line regions 220 is more vulnerable than the other regions because the former is subjected to multiple sawing processes. The thickness-reduced region, e.g., the non-active region 220b, is located within the intersection area and, therefore, can more effectively reduce or prevent cracking of the material layers when the substrate 200 is sawed.

In some embodiments, the circuits or devices (not shown) formed within the die areas 210 are not designed with fuse function. In these embodiments, the fuse opening process described above is not used. However, the purpose of thickness reduction of material layers within the scribe line areas 220 can still be achieved by utilizing the etch processes described in FIGS. 4B and/or 4D.

Figure 4D:
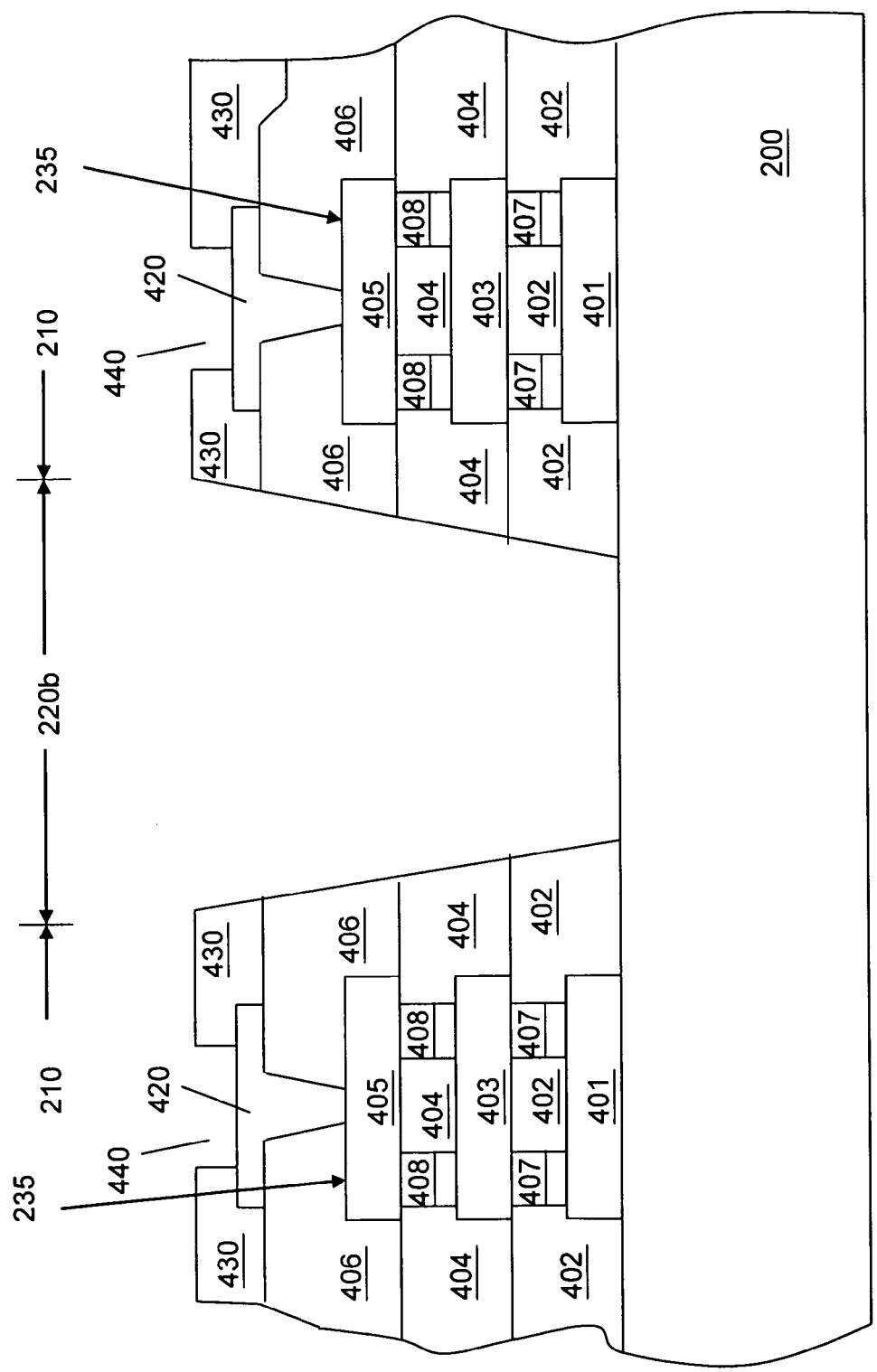

FIG. 4D is a schematic cross-sectional view showing openings formed within the second passivation layer 430 by an exemplary process. After the formation of the fuse openings, a photolithographic process is performed. The photolithographic process is generally referred to as the "Passivation-2 Photo" for definition of openings 440 that partially expose a top surface of the conductive layer 420. In this photolithographic process, a photoresist layer (not shown) is conformally formed over the passivation layer 430 shown in FIG. 4C, covering the die areas 210 and scribe line areas 220. A reticle (not shown) with predefined regions corresponding to the openings 440 is used. The openings 440 are formed in the die areas 210, partially exposing top surfaces of the conductive layers 420 so that a subsequent structure, such as a bump structure, can be formed thereover.

In some embodiment, this reticle also includes at least one predefined region corresponding to the non-active regions 220b (shown in FIGS. 3 and 4D). An exposing process and a developing process are performed to define a desired photoresist pattern with openings (not shown) formed therein partially exposing a top surface of the passivation layer 430 corresponding to the openings 440 and the non-active region 220b. An etch process then removes a portion of the passivation layer 430 within the die area 210 to form the openings 440. Preferably, at least a portion of the dielectric layers 404 and/or 402 within the non-active region 220b is removed. In some embodiments, the etch process removes the entire thickness of at least a portion of the dielectric layers 404 and/or 402 within the non-active region 220b to at least partially expose a top surface of the substrate 200 in the non-active region 220b as shown in FIG. 4D. In other embodiments, the etch process only removes portions of the thickness of the dielectric layers 404 and/or 402 within the non-active regions 220b. The remaining dielectric layers 404 and/or 402 within the non-active region 220b are acceptable as long as the etch process substantially removes the passivation layer 430 within the openings 440. The patterned photoresist layer (not shown) is then removed by a photoresist removal process.

In accordance with the foregoing description, any thickness reduction of at least one layer of material, e.g., the passivation layers 406 and/or 430 and/or the dielectric layers 402 and/or 404, within the scribe line area 220, e.g., the non-active region 220b, can effectively reduce or prevent cracking of the layers of material that extend into the die areas 210. Of course, the thickness of the layers of material removed from the non-active regions 220b can vary according to a desired process flow so that different layers of material are exposed and different thicknesses remain, which are then subjected to a sawing process. In some embodiments, the top surface of the top material layer within the non-active region 220b, when it is subjected to a sawing process, is substantially planar with the top surface of the conductive structure 235 within the die area 210. In other embodiments, the top surface of the top material layer within the non-active region 220b may be lower than the top surface of the conductive structure 235 within the die area 210 by about 4 µm or less.

Figure 4E:
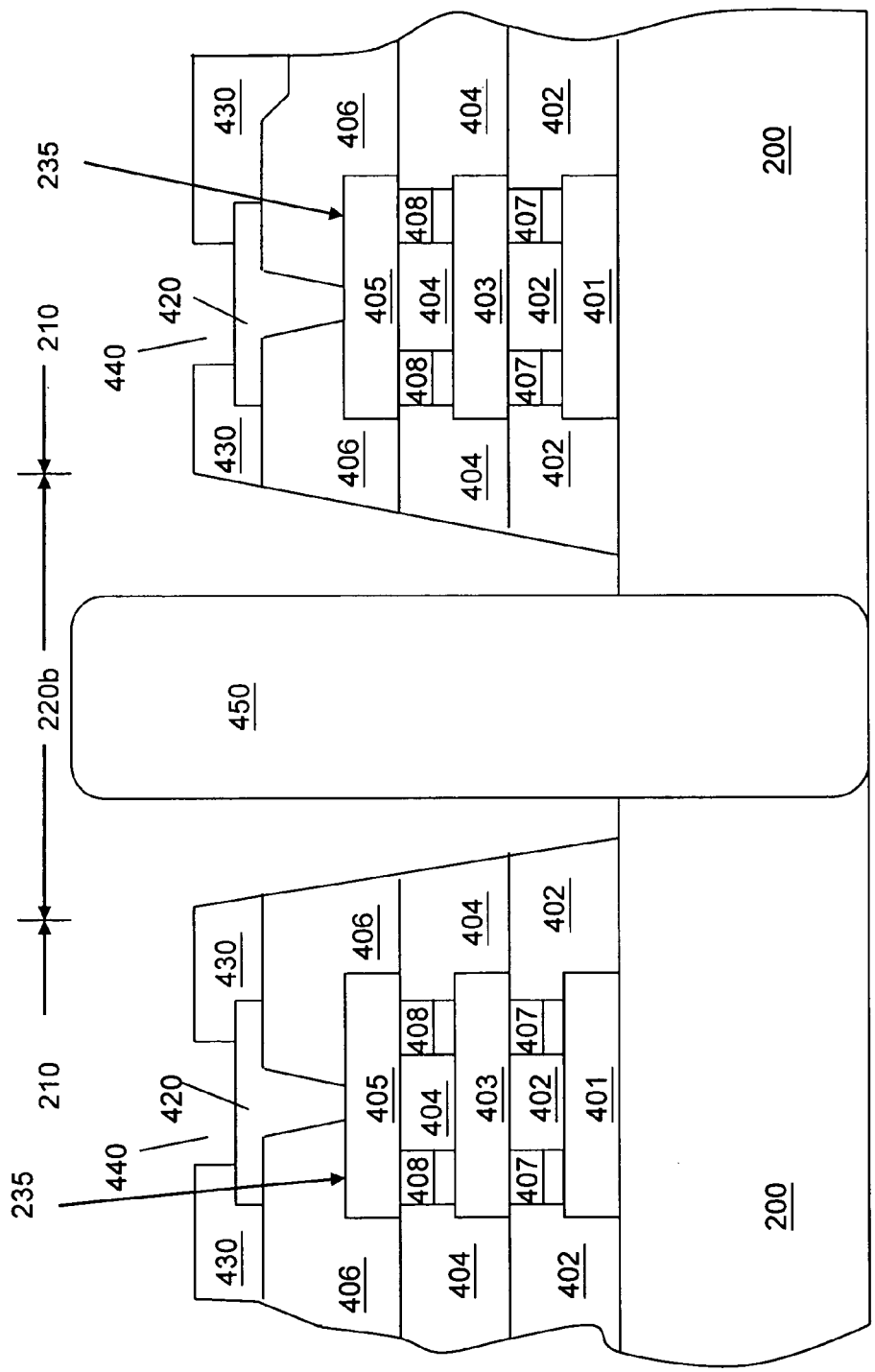

FIG. 4E is a schematic cross-sectional view showing a blade sawing substrate 200 along a scribe line 220 based on an exemplary method. After at least one portion of a material layer, such as a passivation layer or a dielectric layer, is removed from the non-active region 220b, a blade 450 saws the substrate 200 along scribe line areas 220. In some embodiments, the blade 450 for die sawing substantially only contacts the substrate 200 within the non-active regions 220b as shown in FIG. 4E, i.e., the openings above the substrate 200 formed within material layers in the non-active regions 220b are wider than the width of the blade 450. By removal of at least a portion of the thickness of the material layers, such as the dielectric layers 402 and/or 404, and/or passivation layers 406 and/or 430, within the non-active regions 220b, cracking of the layers of material caused by one or multiple sawing processes can be effectively reduced or prevented.

The etch processes described above in connection with FIGS. 4B-4D are merely illustrative of certain exemplary embodiments. The removal of the dielectric layers 402 and/or 404 and the passivation layers 406 and/or 430 described in connection with FIGS. 4B-4D are accompanied by the formation of the via/contact holes 410, fuse openings (not shown) and pad openings 440. In some embodiments, the dielectric layers 402 and 404 and passivation layers 406 and 430 within the non-active regions 220b are not removed or thinned, when the via/contact holes 410, the fuse openings (not shown) and the openings 440 are formed. After WAT measurements, but before sawing, an additional photolithographic process using a reticle including predefined regions corresponding to the scribe line areas 220 is used to form a patterned photoresist layer at least partially exposing the top surface of the passivation layer 430. An etch process then removes at least a portion of the thickness of the at least one layer of material within the scribe line areas 220 to partially expose the passivation layer 430, passivation layer 406, dielectric layer 404, dielectric layer 402, other layer of material formed over the substrate 200 or the top surface of the substrate 200. This exposed region is then sawed.

In other embodiments, the additional photolithographic process and etch process may cooperate with the processes set forth above in connection with FIGS. 4B-4D to thin or remove the material layers within the scribe line areas 220b. For example, after the formation of the openings 440, a portion of the dielectric layers 402 and/or 404 remains on the substrate 200 within the scribe line areas 220, e.g., non-active regions 220b. The additional photolithographic process and etch process can be used to further remove the layers of material, such as the dielectric layers 402 and/or 404, within the scribe line areas 220, e.g., non-active regions 220b. Based on the exemplary embodiments set forth above, one of ordinary skill in the art can readily achieve a desired structure by modifying the photolithographic and etch processes to reduce or prevent cracking of layers of material resulting from a sawing process.

Figure 5:
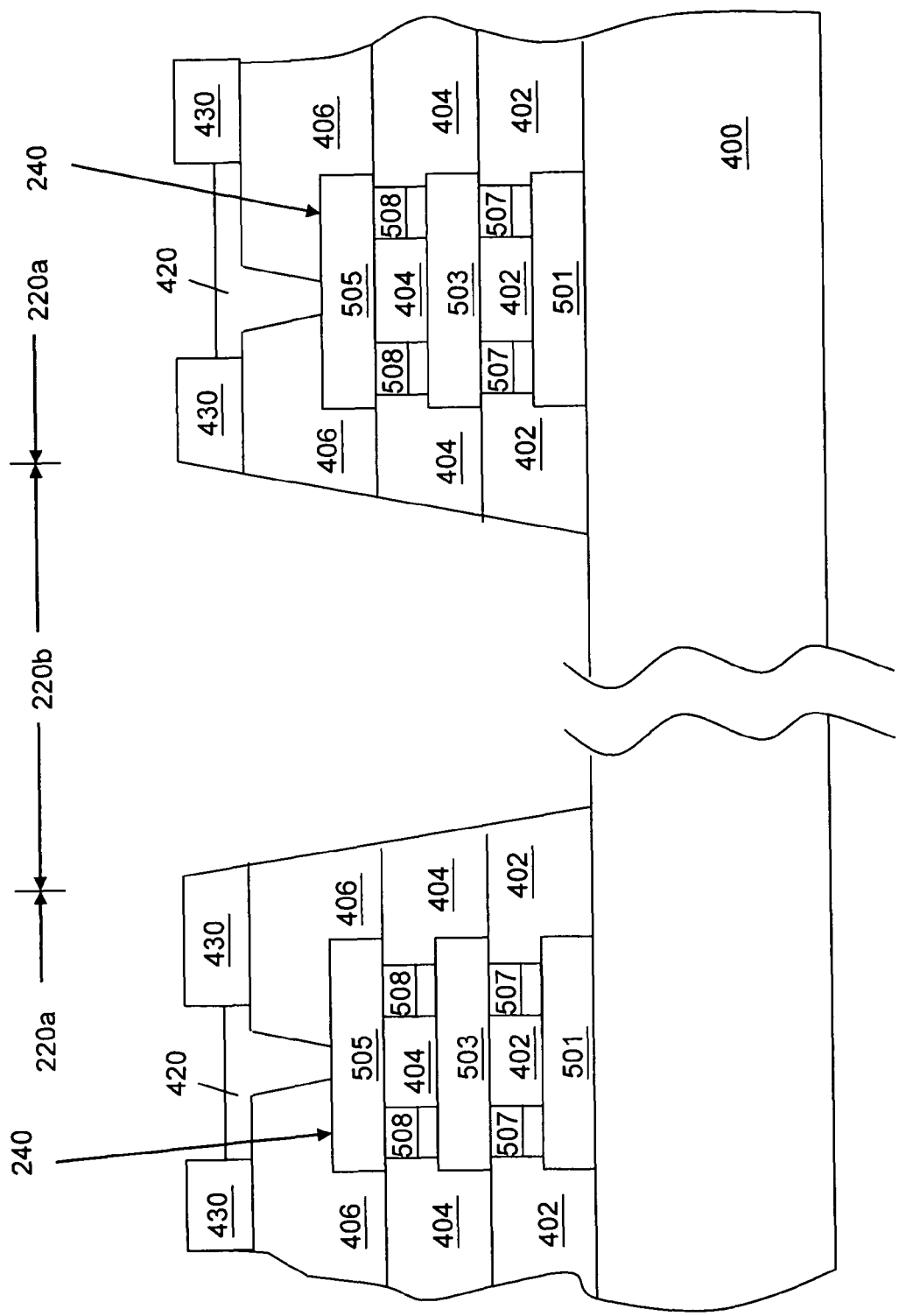
FIG. 5 is a schematic cross-sectional view of an exemplary structure shown in FIG. 3A taken along section line 5-5 of FIG. 3A.

FIG. 5 is a schematic cross-sectional view of an exemplary structure shown in FIG. 3A taken along section line 5-5 of FIG. 3A. Like items shown in FIGS. 5 and 4E are identified by the same reference numerals. The conductive structure 240 comprises at least one conductive layer, such as metal layers 501, 503 and/or 505 and at least one vias/contacts 507 and/or 508. In some embodiments, the metal layers 501, 503 and 505 and vias/contacts 507 and 508 are similar to the metal layers 401, 403 and 405 and vias/contacts 407 and 408 shown in FIG. 4E. In other embodiments, they are conductive layers in levels different from the metal layers 401, 403 and 405 and vias/contacts 407 and 408 and provided for WAT measurements associated with a desired test pattern (not shown).

After WAT measurements, the conductive structure 240 and the test-key pattern (not shown) can be discarded. If remaining within the scribe line areas 220b, the conductive structure 240 and the test-key pattern are subjected to and may be cracked by a sawing process. As described above, additional photolithographic process and etch process, after WAT measurements, may be performed to remove at least a portion of material within the non-active regions 220b, such as the passivation layers 430 and/or 406, the dielectric layers 402 and/or 404, or material layers formed in the active region 220a, such as the conductive layers 501, 503 and/or 505 or the conductive contacts 507 and/or 508, or other layer of material formed within the scribe line areas 220. In these embodiments, while at least partially removing a material layer within the non-active region 220b, the additional etch process also removes at least a portion of a material layer, such as a passivation layer, dielectric layer, conductive layer or conductive structure, formed within the active regions 220a. In some embodiments, the additional etch process removes at least a portion of the conductive structure 240 within the active region 220a to at least partially expose a top surface of the substrate corresponding thereto. The removal of the material layers within the active regions 220a and non-active regions 220b can be achieved as long as the reticle for the additional photolithographic process includes predefined regions corresponding to the active regions 220a. With the reduced thickness within the active regions 220a, cracking of layers of material and the substrate 200 within the scribe line areas 220 can be more effectively reduced or prevented.

Although the foregoing description describes the singulation process by means of sawing, it should be understood that the description applies equally to other singulation methods now known or employed or that may be employed in future technology generations. Examples may include laser singulation, pressurized fluid singulation, etch-through singulation or other techniques.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method of fabricating a structure, the method comprising:
    defining a plurality of scribe line areas surrounding dies on a substrate, each of the scribe line areas comprising at least one active region and at least one non-active region, wherein each of the dies comprises at least one first conductive structure formed therein and the active region comprises at least one second conductive structure formed therein;
    forming a first passivation layer over the first conductive structure within each of the dies and over the second conductive structure within the active region;
    removing at least a portion of the thickness of the first passivation layer within the non-active region, whereby die-sawing damage is reduced; and
    sawing the substrate along the scribe line areas within the non-active region.

2. The method of claim 1, wherein the non-active region is arranged at an intersection region of two of the scribe line areas.

3. The method of claim 1 further comprising forming at least one material layer between the substrate and the first passivation layer, wherein at least a portion of the material layer within the non-active region is also removed.

4. The method of claim 3, wherein at least a portion of the first passivation layer and the material layer are removed so as to at least partially expose a top surface of the substrate within the non-active region.

5. The method of claim 3, wherein the material layer within the non-active region is removed so that an exposed top most surface of the at least one material layer within the non-active region is lower than a top surface of the first conductive structure.

6. The method of claim 1 further comprising:
 forming at least one pad structure over the first conductive structure;
 forming at least one second passivation layer between the second conductive structure and the first passivation layer; and
 removing at least a portion of the second passivation layer formed within the non-active region.

7. The method of claim 1 further comprising removing at least a portion of the second conductive structure within the active region before sawing.

8. The method of claim 7, wherein the second conductive structure is at least partially removed so as to at least partially expose a top surface of the substrate within the active region.

9. A method for sawing a semiconductor die, the method comprising:
 providing a semiconductor substrate having a die area comprising at least one conductive structure formed therein and a scribe line area comprising at least one active region and at least one non-active region;
 forming at least one material layer over the semiconductor substrate over the conductive structure within the die area and over the scribe line area;
 removing at least a portion of a thickness of the at least one material layer from the non-active region;
 forming at least one first passivation layer over the at least one material layer over the conductive structure within the die area and over the scribe line area;
 reducing at least a portion of a thickness of the first passivation layer within the non-active region so as to at least partially expose a top most surface of the at least one material layer within the non-active region, said top most surface of the at least one material layer being lower than a top surface of the at least one conductive structure; and
 sawing the semiconductor substrate along the scribe line area within the non-active region.

10. The method of claim 9, wherein the at least one material layer includes a bottom dielectric layer and a top dielectric layer adjacent to the first passivation layer, and said removing at least a portion of a thickness of the at least one material layer comprises removing an entire thickness of the top dielectric layer.

11. A method for sawing a semiconductor die, the method comprising:
 providing a semiconductor substrate having a die area comprising at least one conductive structure formed therein and a scribe line area comprising at least one active region and at least one non-active region;
 forming at least one dielectric material layer over the semiconductor substrate over the conductive structure within the die area and over the scribe line area;
 removing the at least one dielectric material layer from the non-active region;
 forming at least one first passivation layer over the at least one dielectric material layer over the conductive structure within the die area and within the scribe line area;
 reducing at least a portion of a thickness of the first passivation layer within the non-active region so as to at least partially expose a top surface of the semiconductor substrate within the non-active region; and
 sawing the semiconductor substrate along the scribe line area within the non-active region.

* * * * *